United States Patent [19]
Li

[11] Patent Number: 5,392,011
[45] Date of Patent: Feb. 21, 1995

[54] TUNABLE FILTER HAVING CAPACITIVELY COUPLED TUNING ELEMENTS

[75] Inventor: Richard C. Li, Plantation, Fla.

[73] Assignee: Motorola, Inc., Schaumburg, Ill.

[21] Appl. No.: 979,017

[22] Filed: Nov. 20, 1992

[51] Int. Cl.⁶ .............................................. H03H 7/12
[52] U.S. Cl. ........................... 333/174; 333/175
[58] Field of Search ....................... 333/167, 174–176, 333/168; 334/15; 455/193.2, 193.3, 266, 285, 286, 307, 339, 340

[56] References Cited

U.S. PATENT DOCUMENTS

| | | | |
|---|---|---|---|
| 1,227,113 | 5/1917 | Campbell | 333/168 |
| 3,049,682 | 8/1962 | Waring | 333/174 |
| 3,534,301 | 10/1970 | Golembeski | 333/204 |
| 3,798,578 | 3/1974 | Konishi | 333/229 |
| 4,157,517 | 6/1979 | Kneisel | 333/205 |
| 4,264,881 | 4/1981 | De Ronde | 333/110 |
| 4,430,630 | 2/1984 | Sakamoto | 334/15 |
| 4,578,656 | 3/1986 | Lacour | 333/204 |
| 4,586,007 | 4/1986 | Ciszek | 333/174 X |
| 4,601,062 | 7/1986 | Hettiger | 333/176 X |
| 4,609,829 | 9/1986 | Higgins | 333/204 |
| 4,661,790 | 4/1987 | Gannon | 333/234 |
| 4,785,271 | 11/1988 | Higgins | 333/204 |
| 4,839,617 | 6/1989 | Speake | 333/174 |
| 4,940,955 | 7/1990 | Higgins | 333/204 |
| 4,992,759 | 2/1991 | Giraudeau | 333/204 |
| 5,021,757 | 6/1991 | Kobayashi | 333/205 |
| 5,066,933 | 11/1991 | Komeda | 333/204 |
| 5,138,288 | 8/1992 | Blackburn | 333/202 |
| 5,150,085 | 9/1992 | Hales | 333/174 |
| 5,241,291 | 8/1993 | Blackburn | 333/219 |

FOREIGN PATENT DOCUMENTS

| | | | |
|---|---|---|---|
| 0413211 | 2/1991 | European Pat. Off. | 333/219 |
| 0111412 | 6/1984 | Japan | 333/205 |
| 0060303 | 2/1990 | Japan | 333/219 |

Primary Examiner—Seungsook Ham
Attorney, Agent, or Firm—Robert S. Babayi; M. Mansour Ghomeshi

[57] ABSTRACT

A tunable filter (100) is provided including a first resonator (110) and a second resonator (120). The bandwidth of the tunable filter is maintained constant by providing purely inductive coupling (114) between the first and the second resonators (110 and 120). The first and the second resonators (110 and 120) include tuning elements (108–109 and 118–119) which are second coupled to each other by means of a capacitor (130) to improve image rejection performance of the tunable filter (100).

4 Claims, 3 Drawing Sheets

TUNABLE FILTER HAVING CAPACITIVELY COUPLED TUNING ELEMENTS

TECHNICAL FIELD

This invention relates in general to filters and more particularly to tunable filters for providing front-end selectivity for a radio receiver.

BACKGROUND

Performance of radio receivers are highly dependent on the selectivity of the receiver front end. Front-end selectivity is generally provided by a pass-band filter. Pass band filters come in variety of structural and topological arrangements. Most pass-band filters include a plurality of reactively coupled resonators which are resonant at a center frequency. Generally, the resonators are coupled to each other by reactive components, such as capacitors, inductors or combination thereof. A number of factors, including the type and number of resonators in the filter topology, determine the selectivity of a filter. Depending on the application, the filter topology may include any number of quarter-wave or half-wave resonators, or a combination of them.

Front-end filters may have fixed bandwidths or they may have tunable bandwidths. Filters having fixed bandwidths are usually used in narrow band receivers where the operational frequency is limited to a narrow range. On the other hand, filters having tunable bandwidth may be used in wideband receivers where the range of operational frequency is substantially large and covers a wider bandwidth. The tunable filters are particularly suitable in reducing manufacturing cost of receiver units because they allow a single receiver front end circuit to cover an entire allocated frequency band, thus eliminating the need for designing multiple front-end circuit boards for covering a number of sub-bands within the frequency band.

Most tunable filters are varactor tuned. Each resonator includes a tuning element comprising one or more varactors which in response to a control voltage provide the tuning mechanism for the tunable filter. By varying the control voltage, the filter may be tuned to provides a narrow bandwidth for a desired frequency of operation. Each resonator includes a tuning element, such as a single varactor a pair of back-to-back varactors such that upon simultaneous application of the control voltage, the center frequencies of the resonators are varied. In this way the tuning elements receive identical control voltages, and as these control voltages vary, the filter is tuned for a desired bandwidth within a tuning range.

An important consideration in designing tunable filters is maintaining a constant bandwidth throughout the tuning range. Conventional approaches, however, cannot maintain such a constant bandwidth. Thus, at certain frequencies, within the tuning range, the bandwidth of the filter varies as the control voltage applied to the varactors varies. Another important factor in tunable filter design is providing a substantially high image rejection. Conventional resonator coupling techniques which utilize a capacitor or a combination of capacitors and inductor has been found to be a major contributor to the occurrence of non-constant bandwidth over the tuning range where the bandwidth becomes wider and wider when the filter is tuned from a low to a high frequency. As a result, near the high end of the RF, image rejection becomes very poor and tuning becomes meaningless.

A partial solution has been found, using purely inductive coupling between the resonators. As such, a single coupling inductor makes the bandwidth of the filter independent from the resonator frequency, thereby the bandwidth is maintained constant over the tuning range since. However, such purely inductive coupling still does not address or improve the image rejection performance of the filter. Therefore, there still exists a need for a tunable filter which maintains a substantially constant narrow bandwidth over the entire tuning range while providing a substantially superior image rejection performance.

SUMMARY OF THE INVENTION

Briefly, according to the invention, there is provided a tunable filter having a first resonator and a second resonator. The first resonator and the second resonator are coupled to each other by means of a purely inductive coupling means to provide a constant bandwidth over the tuning range. The first resonator includes a first tuning element and the second resonator includes a second tuning element for tuning the center frequency of the tunable filter. Image rejection of the filter is improved by capacitivly coupling the first tuning element to the second tuning element.

DETAILED DESCRIPTION OF THE PREFERRED EMBODIMENT

Figure 1:
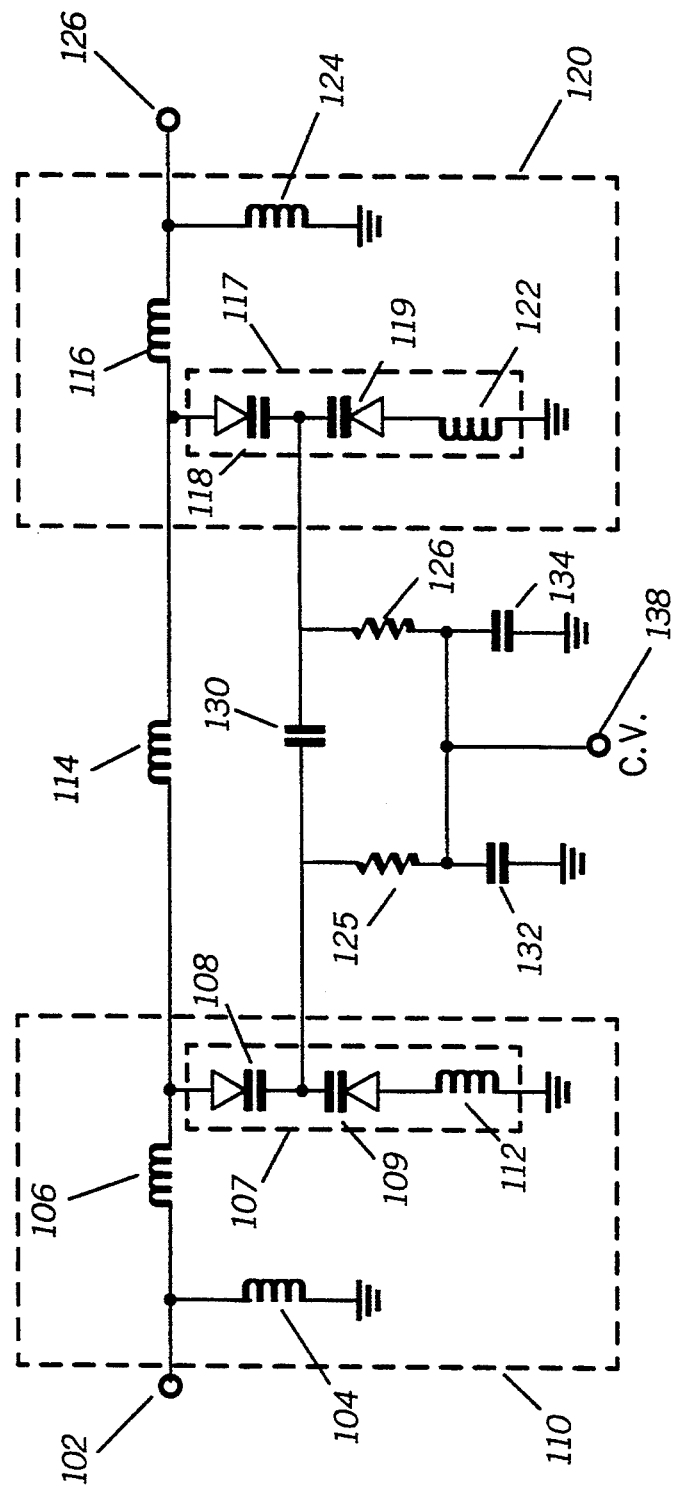
FIG. 1 is a schematic diagram of a high-side-injection tunable filter according to the present invention.

While the specification concludes with claims defining the features of the invention that are regarded as novel, it is believed that the invention will be better understood from a consideration of the following description in conjunction with the drawing figures, in which like reference numerals are carried forward.

Referring to FIG. 1, a schematic diagram of a tunable filter 100 according to one embodiment of the present invention is shown. In this embodiment the filter 100 is arranged to provide front-end selectivity for a high-side-injection receiver, where the receiver carder frequency is lower than the LO injection frequency. The filter 100 comprises a two-pole filter including a pair of reactively coupled first and second resonators 110 and 120. The filter 100 includes a first port 102 and a second port 126 constituting the input and the out-put ports of the filter 100 as appropriate. The first and the second resonators 110 and 120 comprise well-known tank-circuits which may be tuned to be resonant at a specified center frequency. The first resonator 110 includes a tuning element comprising back-to-back varactors 108 and 109 which receive a control signal C.V. at a port 138 through a resistor 125. The second resonator 120 includes a second tuning element comprising back-to-back varactors 118 and 119 which receive the control signal through a resistor 126. Decoupling capacitors 132 and 134 provide RF filtering for the control signal C.V. in a well-known manner.

In order to provide the high-side-injection selectivity, the first resonator 110 is arranged to include a shunted inductor 104 and a shunted series resonant circuit 107 comprising the back-to-back varactors 108 and 109 and inductor 112. An inductor 106 is coupled between the inductor 104 and the shunted series resonant circuit 107. The value of inductors 104, 106, and 112 as well as back-to-back varactors 108 and 109 are appropriately selected to provide a desired termination impedance at port 102. Similar to the first resonator 110, the second resonator 120 includes a shunted inductor 124 which is coupled via an inductor 116 to a shunted series resonant circuit 117 comprising varactors 119 and 118 and the inductor 122. The inductor and varactor components of the second resonator 120 are also appropriately selected to present a desired impedance at the port 126.

In order to provide optimum selectivity the bandwidth of a tunable filter must be kept constant over the entire tuning range. In some designs of varactor-tuned filters, the bandwidth is considerably varied from low end to high end because the coupling between the resonators include a capacitor alone or in combination with other components, such as an inductor. It has been found that any resonator coupling which includes a capacitive element makes the bandwidth dependent upon the tuning frequency. However, as described before, the purely inductive coupling makes the bandwidth of the tunable filter independent of the tuning frequency. In the filter 100, the first resonator 110 and the second resonator 120 are coupled to each other via an inductor 114, thus providing a purely inductive coupling therebetween. Therefore, when the center frequency is tuned, the bandwidth remains substantially constant.

In addition to maintaining constant bandwidth, the filter 100's image rejection is improved by creating a substantially steep frequency response between the image rejection frequencies (at the high side or the low side) and the 3 dB points.

According to the invention, the tuning elements of the first resonator and the second resonator are capacitively coupled to each other to create zeros at the upper and lower skirts of the filter response. Therefore, capacitor 130 is coupled between the tuning elements of the first resonator 110 and the second resonator 120. In this arrangement, the capacitor 130 is coupled between the common junctions of varactor pair 109 and 108 and the common junction of varactor pair 118 and 119. The capacitor 130 provides a second coupling component between the two resonator circuits 110 and 120 which produces around center frequency. The zeros are appropriately positioned to provide an outstanding image rejection for the filter 100. For the high-side-image rejection filter 100, the addition of the capacitor 130 produces a zero at the high side image rejection frequency which is equal to the center frequency plus twice the intermediate frequency. The second coupling of the capacitor 130 also forces the zeros to track the bandwidth at the center frequency is varied upon variations of the control signal C.V.

Figure 2:
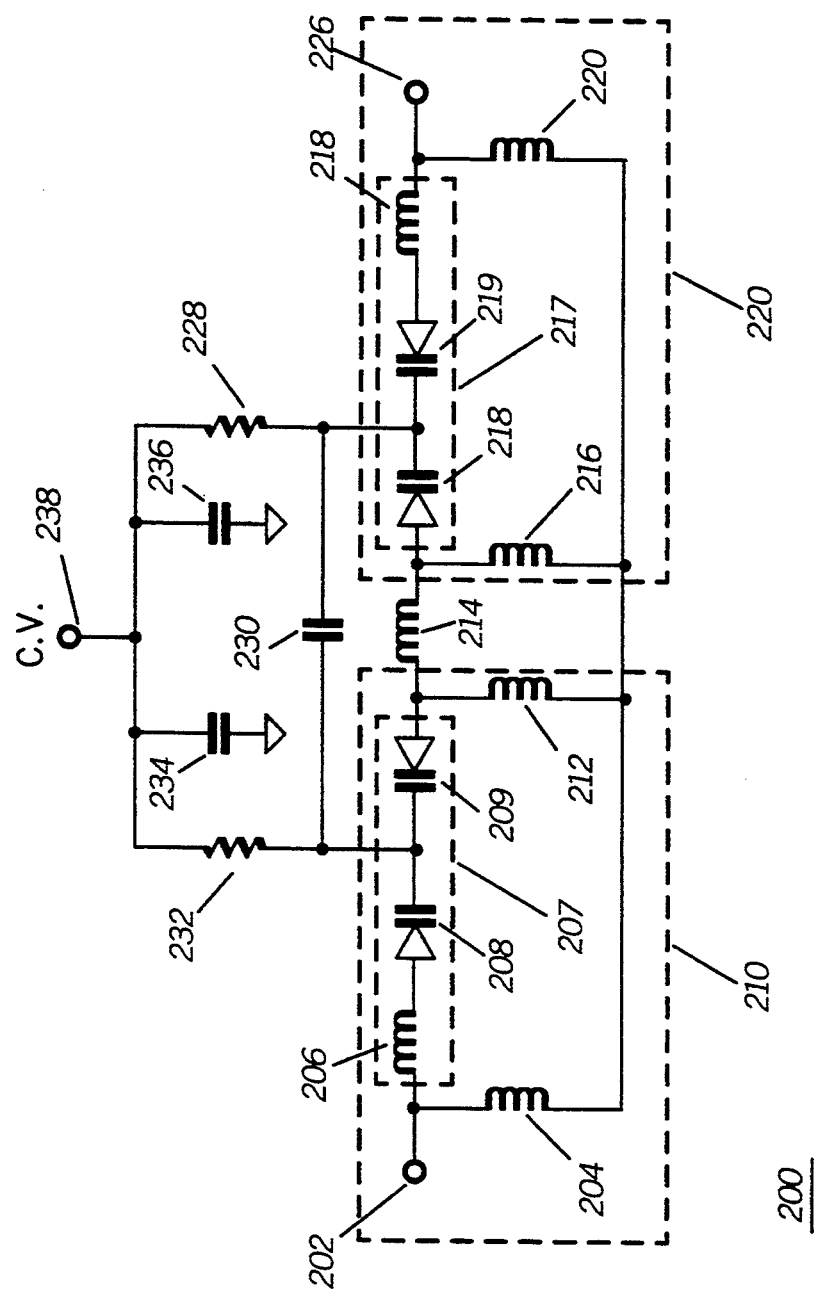
FIG. 2 is a schematic diagram of a low-side-injection tunable filter according to the present invention.

Referring to FIG. 2, schematic diagram of a tunable filter 200 is shown according to another embodiment of the present invention. The filter 200 is a low-side injection filter having termination ports 202 and 226 which may be tuned to provide front end selectivity in a low-side injection receiver. The filter 200 includes a first resonator 210 and a second resonator 220 which are coupled to each other through an inductor 214. The inductor 214 provides a purely inductive coupling between the resonators 210 and 220 which makes the bandwidth of the filter independent from the center frequency being tuned. The first resonator 210 includes a first tuning element comprising back-to-back varactors 208 and 209, and the second resonator includes a second tuning element comprising the back-to-back varactors 218 and 219. As it is well known in a low-side-injection, the receiver carrier frequency is usually higher than the LO injection frequency. For providing a low-side-injection frequency response, the first resonator 210 and the second resonator 220 include series resonant circuits 207 and 217 which are coupled between two shunted inductors. In the resonator 210, the series resonant circuit 207 includes an inductor 206 which is serially coupled to the back-to-back varactors 208 and 209, and the shunted inductors comprise inductors 204 and 212. Similarly, the second resonator 220 includes the second series resonant circuit 217 comprising back-to-back varactors 218 and 219 and the inductor 218. The second series resonant circuit 217 is coupled between shunted inductors 218 and 220. The filter 200 receives its control voltage C.V. at a port 238 which applies it simultaneously to the tuning elements of the first resonator 210 and the second resonator 220 through resistors 232 and 228, as illustrated. The decoupling capacitors 236 and 234 are coupled to the port 238 to prevent RF signals from effecting the control voltage C.V.

As with the filter 100, the low-side image rejection is improved by providing a second capacitive coupling between the tuning elements of the resonators 210 and 220. The second capacitive coupling in the filter 200 is provided by the capacitor 230 which creates a zero at the low-side-image frequency and another zero at the high side of the frequency response.

Figure 3:
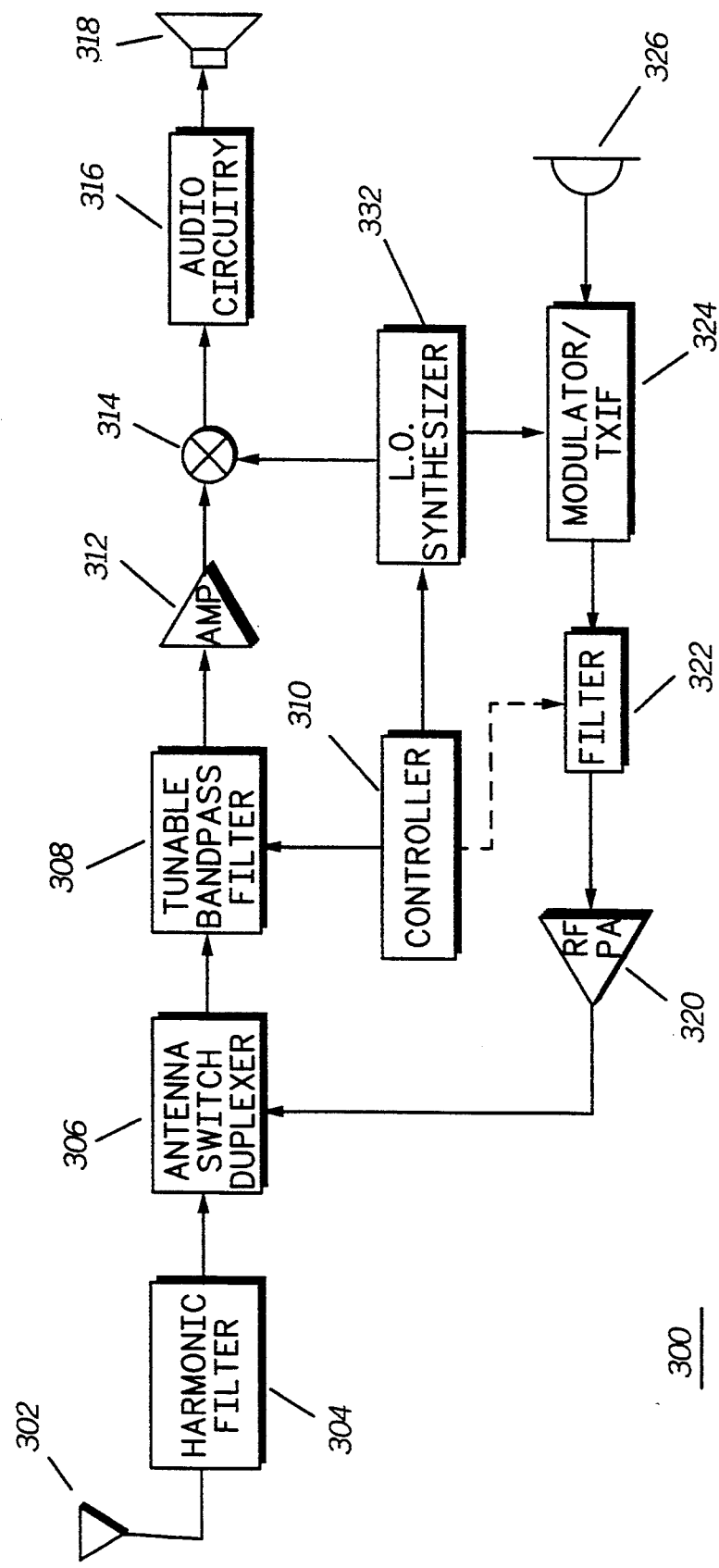
FIG. 3 is a block diagram of a radio utilizing the tunable filter of the present invention.

Referring to FIG. 3, the tunable filter of the present invention is utilized in a radio 300 comprising any well-known radio, such as a portable two-way radio manufactured by Motorola Inc. The radio 300 may operate in either receive or transmit modes. The radio 300 includes means for communicating communication signals such as a receiver and a transmitter which utilize a tunable filter according to the present invention for filtering the communication signals.

In receive mode, the portable radio 300 receives the communication signal via an antenna 302. A transmit/receive (T/R) switch 306, through a harmonic filter 304, couples the received communication signal to a tunable filter 308. The filter 308 comprises a tunable filter according to the present invention which provides front-end selectivity for the received communication signal. The output of the filter 308 is applied to an amplifier 312 and a mixer 314. The mixer section 314 receives a receiver local oscillator (LO) injection signal from an LO synthesizer 332 for producing an IF signal. As is well known, depending on receiver design, the LO injection signal may be on the high-side or on the low-side of the carrier frequency. The output of the receiver IF section is applied to a well-known audio section 316 which, among other things, amplifies audio messages and presents them to a speaker 318. The tuning control voltage C.V. is provided by a controller 310 which may also provide operational control for the entire radio 300 in a well-known manner.

In the transmit mode, audio messages are inputted via a microphone 226, the output of which is applied to a well-known modulator/TX IF section 324 to provide a modulating signal to a filter 322. The TX IF section also receives a TX LO signal from the LO synthesizer 332.

Although the tunable filter of the present invention is particularly suitable for providing front-end selectivity for a receiver, it may be appreciated that a transmitter section may also advantageously utilize the tunable filter of the present invention for a variety transmitter specific filtering requirements. Therefore, the filter 322 may also be responsive to the controller 310 (as shown with the dotted line) for tuning it for a desired bandwidth. A transmitter power amplifier 320 amplifies the output of the filter 322 and applies it to the antenna 302 through the T/R switch 306 for transmission of the communication signal.

As described above, the high-side and low-side injection filters 100 and 200 of the present invention significantly improve image rejection and bandpass response. The substantially constant bandwidth over the tuning range is achieved through coupling the resonators of the filter by purely inductive means, i.e., an inductor. Furthermore, the image rejection performance is improved by capacitively coupling the tuning elements of the resonators to create at least one zero at the image rejection frequency. The principal of the present invention, therefore, provides a simple solution to a significant problem encountered in prior art filters.

What is claimed is:

1. A tunable filter, comprising:
   a first resonator having a series resonant circuit including a first tuning element and coupled between two shunted inductors;
   a second resonator having a second tuning element;
   coupling means for coupling the first resonator to the second resonator;
   a capacitor for capacitively coupling the first tuning element to the second tuning element.

2. The tunable filter of claim 1, wherein said coupling means comprises a purely inductive coupling means.

3. The tunable filter of claim 1, wherein at least one of said first tuning element and said second tuning element comprise back-to-back varactors.

4. The tunable filter of claim 1, wherein said series resonant circuit comprises the first tuning element and an inductor.

* * * * *